Nov. 13, 1956 J. J. LENTZ 2,770,725

BINARY-DECADE COUNTER

Filed Dec. 21, 1951 3 Sheets-Sheet 1

INVENTOR.
JOHN J. LENTZ
BY Dwight D. Mooney
ATTORNEY

INVENTOR
JOHN J. LENTZ
BY Dwight D. Mooney
ATTORNEY

Nov. 13, 1956 J. J. LENTZ 2,770,725

BINARY-DECADE COUNTER

Filed Dec. 21, 1951 3 Sheets-Sheet 3

INVENTOR
JOHN J LENTZ

BY Dwight D. Mooney
ATTORNEY

United States Patent Office 2,770,725

Patented Nov. 13, 1956

2,770,725

BINARY-DECADE COUNTER

John J. Lentz, Chappaqua, N. Y., assignor to International Business Machines Corporation, New York, N. Y., a corporation of New York Application December 21, 1951, Serial No. 262,802

12 Claims. (Cl. 250—27)

Figure 1:
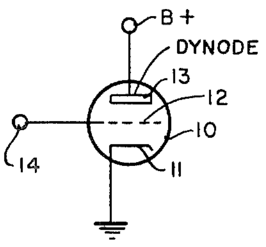

This invention relates to electronic counters and more particularly to a novel binary-decade counter using four trigger circuits each having two stable conditions alternately assumed.

One type of conventional binary-decade counter uses four inherently binary trigger circuits connected in series chain, the first trigger circuit of the chain being supplied with input pulses to normally effect a regular binary switching of the trigger circuits. Feedback between one or more trigger circuits or any of a variety of pulse blocking arrangements may be utilized to effect an additional switching of preselected ones of the trigger circuits or for preventing normal switching of certain trigger circuits or both. Such arrangements effect conversion of the counter to decade operation. However, such are disadvantageous in that the feedback operation is time consuming and frequently requires critical adjustment to obtain proper relative pulse amplitudes.

Accordingly, a principal object of this invention is to provide a novel binary-decade counter using four inherently binary trigger circuits wherein the conversion to decade operation is accomplished without any of the above disadvantages.

Another object is to provide a novel electronic counter using inherently binary counting elements wherein each input pulse is applied substantially simultaneously to each counting or storage element to be switched thereby and at no time does the switching of one counting element by any given input pulse cause a switching or prevent the switching of another counting element in response to that input pulse.

A further object is to provide a novel binary-decade counter wherein input pulses are selectively applied to the storage elements individually to effect storage in decade fashion.

A still further object is to provide an electronic counter wherein the storage elements are individually and selectively supplied with input pulses through serially connected unidirectional current devices each connected to a different one of the storage elements to be rendered responsive to input pulses in accordance with the stable condition of that storage element to thereby determine whether or not the next input pulse will be applied to the storage elements connected to certain other unidirectional current devices.

Another object is to provide a binary-decade counter having four inherently binary counting elements wherein connections are made from each element to the two terminals of a diode such that a pulse applied to either connection may switch that element from one stable condition to the other and each diode is connected in series with the others with one being connected to a source of input pulses so that the voltage transferred to a diode from its corresponding counting element determines whether or not the next input pulse will render subsequent serially connected diodes current responsive.

Other objects of the invention will be pointed out in the following description and claims and illustrated in the accompanying drawings, which disclose, by way of example, the principle of the invention and the best mode, which has been contemplated, of applying that principle.

In the drawings:

Fig. 1 is a diagrammatic sketch of a secondary emission type tube.

Figure 1A:
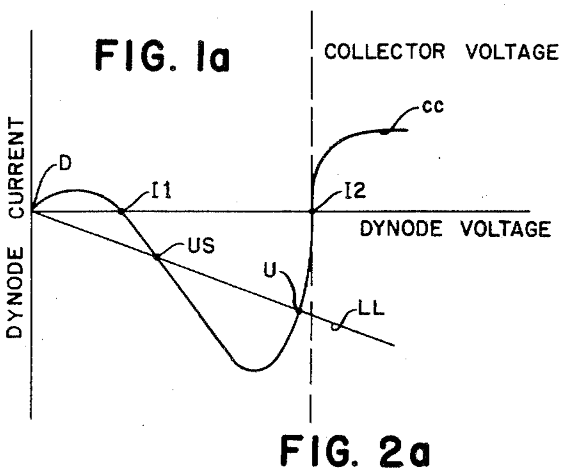

Fig. 1*a* shows a performance curve illustrating the operation of the tube of Fig. 1.

Figure 2:
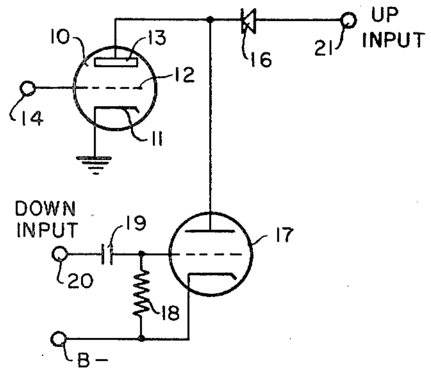

Fig. 2 shows one embodiment of a trigger circuit using a secondary emission type tube.

Figure 2A:
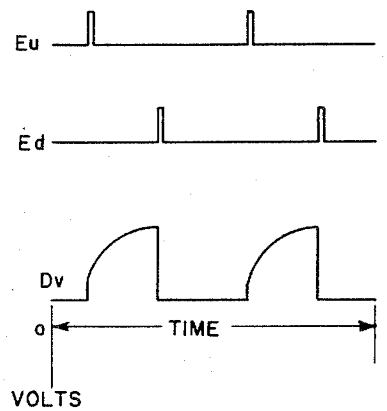

Fig. 2*a* shows performance curves for the trigger circuit shown in Fig. 2.

Figure 3:
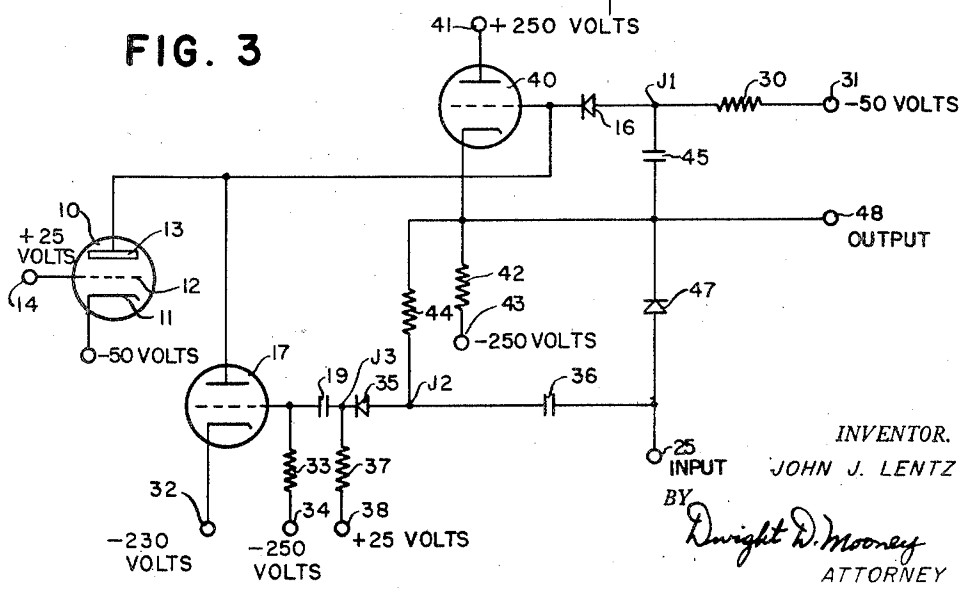

Fig. 3 is a circuit diagram of a trigger circuit of the type which may be utilized by the invention.

Figure 3A:
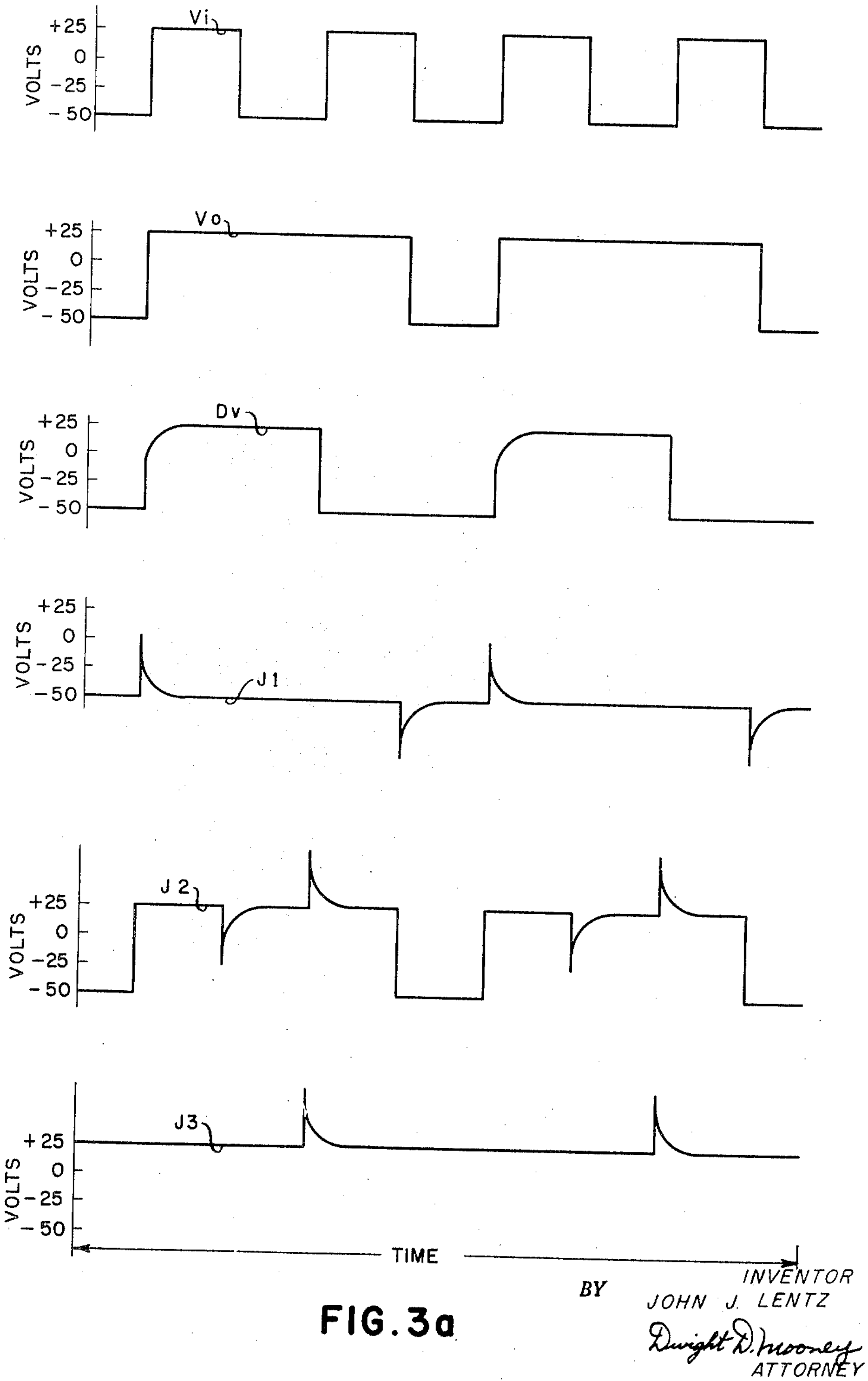

Fig. 3*a* shows a performance curve illustrating the operation of the trigger circuit shown in Fig. 3.

Figure 4:
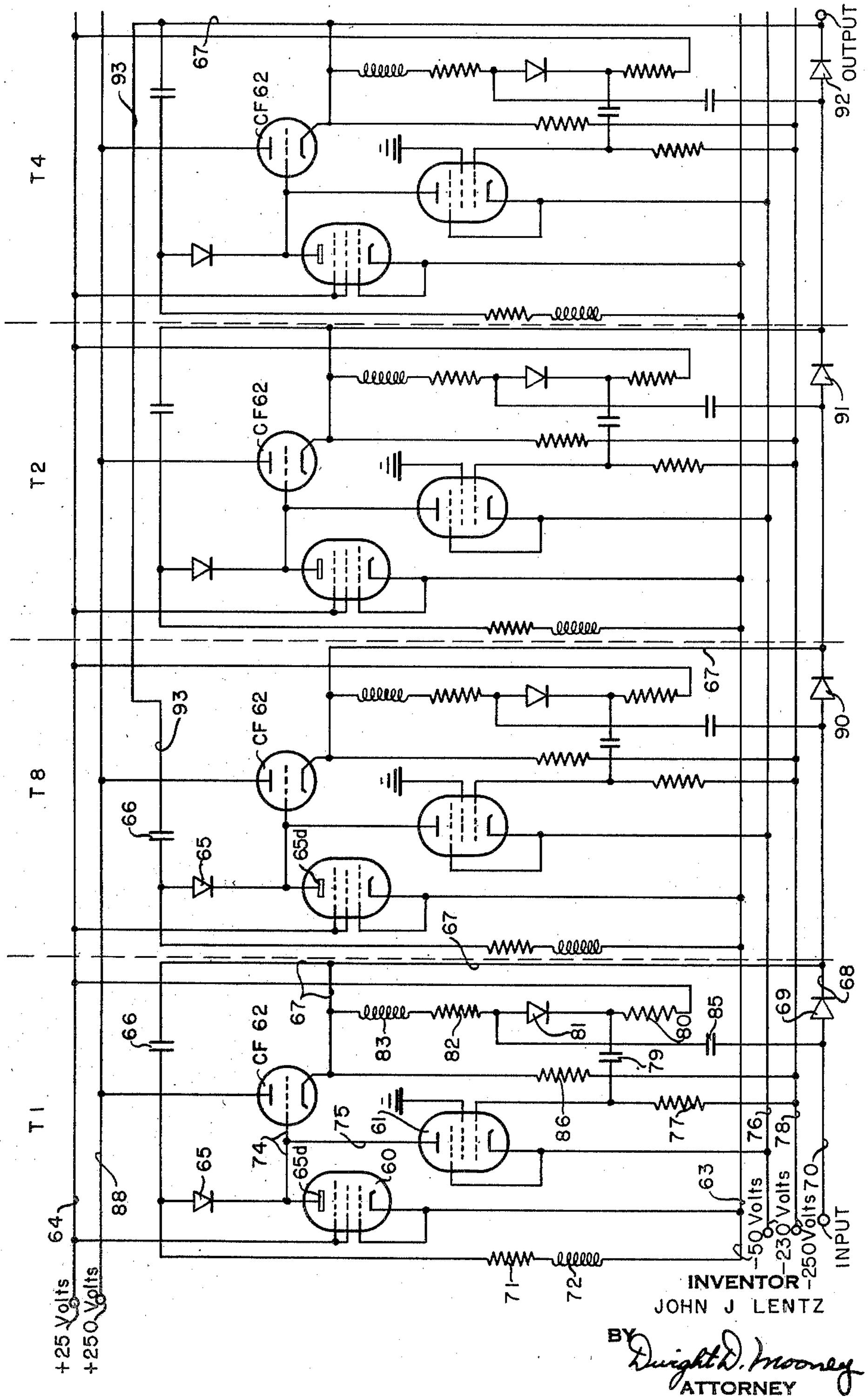

Fig. 4 is a circuit diagram of one embodiment of the counter of the invention.

Briefly, the invention utilizes four inherently binary elements, shown as secondary emission type trigger circuits, to provide a decade counter. Four crystal diodes are connected in series chain with one being connected to a source of pulses to be counted or stored. Each trigger circuit is connected to each terminal of a different one of the diodes and the trigger circuits are so arranged that if a pulse is normally applied to either of these connections at the diode the trigger circuit may be switched from one stable condition to the other dependent upon the stable condition of the trigger prior to reception of the input pulse. These connections transfer voltages from the trigger circuit to the terminals of the diodes. Hence, if a trigger circuit is in one pre-selected stable condition the voltage present at the terminals at the diode to which it is connected are such that the next input pulse applied to this diode will not render it conductive. Hence, the next input pulse is not applied to succeeding serially connected diodes and the trigger circuits connected thereto cannot be switched by this next pulse. In order to change the cycle of operation from binary to decade two trigger circuits are commonly connected to one diode terminal and one of these trigger circuits is switchably connected to only one terminal of its corresponding diode. Conversion to decade operation is therefore accomplished by the preselected disabling and application of the input pulses to certain trigger circuits and in no case is it dependent upon pulse interaction or pulse blocking to prevent or cause a certain switching of the trigger circuit.

Referring more particularly to Figs. 1 and 1*a* there is shown in Fig. 1 a schematic representation of a tube 10 of the secondary emission type including a cathode 11, collector 12 and dynode 13, and in Fig. 1*a* there is shown the performance characteristic for the circuit of Fig. 1.

This characteristic curve represents the change in the dynode current as the dynode voltage is varied, the collector being maintained at some constant positive voltage value.

Cathode 11 of tube 10 is connected to ground and the collector 12 is suitably connected to a source of constant positive voltage designated as 14. The dynode 13 is connected to a source of variable positive voltage designated B+. To obtain the characteristic curve CC the dynode-cathode voltage is varied (i. e., B+ varied) and the dynode current is measured. As the voltage on the dynode is increased from zero, electrons flow from the cathode to the dynode. This flow corresponds to the conventional current flow in an electron tube and is indicated by the initial portion of the curve above the abscissa. As the dynode voltage is further increased the electrons striking the dynode cause secondary electrons to be released and a corresponding decrease in the net electron flow to the dynode. Finally, the dynode current reaches zero at the point I1.

The particular material on the surface of the dynode determines the secondary emission actually obtained. The characteristic curve was obtained when a magnesium-silver alloy was employed.

As the dynode voltage is increased beyond the point I1 the number of secondary electrons exceeds the number of primary electrons travelling from the cathode to the dynode and the dynode current reverses its direction of flow. A further increase of the dynode voltage causes an increased number of secondary electrons to be emitted until the dynode voltage approaches the collector voltage. At this stage of operation space charge effects cause decreasing numbers of secondary electrons to reach the collector. Thus where the collector voltage and dynode voltage are substantially equal the primary and secondary electrons approaching and leaving the dynode respectively are substantially equal and the current flow is zero at the dynode. This point is designated as I2. A further increase of the dynode voltage until it is more positive than the collector voltage causes another reversal in the direction of the current flow. In such case the small initial velocities of the initial electrons is insufficient to overcome the retarding field between the dynode and cathode and these electrons are forced back to the dynode.

If a load (not shown) is inserted between the dynode and the cathode the corresponding load line LL intersects the characteristic curve CC at three points, designated D, US and U. The points D and U represent stable states of equilibrium referred to herein as the Down and Up conditions respectively and the point US represents an unstable state of equilibrium. If the actual dynode voltage value is found to the right of point US the dynode current will exceed the current through the load and the dynode voltage will automatically increase until the point U is reached and the circuit will there remain in stable equilibrium until this condition is disturbed from an external source. Also, if the actual dynode voltage value is to the left of the point US this voltage will automatically decrease until the point D is reached and the circuit will there remain in stable equilibrium until this condition is disturbed from an external source. When stable operation occurs at the point D the dynode voltage is down and when the stable condition occurs at the point U the dynode voltage is up. Hence, when the dynode voltage is down the trigger circuit is in the Down condition. When the dynode voltage is up the trigger circuit is in the Up condition.

Referring to Fig. 2 a crystal diode 16 is used as a load for the dynode 13. A grid controlled tube has its plate connected in parallel with the dynode. The cathode of the tube 17 is connected with a suitable source of negative voltage designated B— from which bias voltage is obtained for the control grid of the tube 17 through an appropriate resistor 18. This control grid is also connected through a coupling condenser 19 to a Down input terminal 20. An Up input terminal is connected to the diode 16.

The operation of this circuit is clearly understood by reference to Figs. 2 and 2*a*. If a positive pulse represented by the curve E*u* is applied to the Up terminal 21 the dynode voltage is increased beyond the unstable condition and reaches a condition of stable equilibrium in the Up condition as indicated by the increased dynode voltage shown by the curve D*v*. If a positive pulse represented by the curve E*d* is now applied to the Down terminal 20 the tube 17 is rendered plate current conductive as a result of the positive voltage applied to its control grid. The resulting decreased voltage at the plate of the tube 17 causes a similar decreased voltage at the dynode 13 to which it is connected. This decreased voltage causes the dynode voltage to decrease below its voltage at the point US as shown in Fig. 1*a* and to adjust itself in stable equilibrium in the Down condition. Subsequent input pulses to terminals 21 and 20 cause a repetition of this operation.

Referring to Fig. 3 the trigger circuit is provided with a single input terminal 25 connected to a source of positive pulses (not shown) to effect a switching of the trigger circuit from either stable condition to the other. Solely for the purpose of clarity of explanation such is undertaken with reference to the particular voltage values and the performance curves of Fig. 3*a*.

The tube 10 has its dynode 13 connected through a crystal diode 16 and a resistor 30 to a —50 volt terminal 31. The dynode is also connected to the plate of grid controlled tube 17 whose cathode is connected to a —230 volt terminal 32. The grid of the tube 17 is connected through a bias resistor 33 to a —250 volt terminal 34 and through condenser 19, crystal diode 35 and condenser 36 to the input terminal 25. The juncture J3 of condenser 19 and diode 35 is connected through bias resistor 37 to a +25 volt terminal 38. A grid controlled tube 40 operated as a cathode follower has its plate connected to a —250 volt terminal 41 and its cathode connected through resistor 42 to a —250 volt terminal 43 and through a resistor 44 to the juncture of diode 35 and condenser 36, which juncture is designated as J2. A condenser 45 is connected between the juncture of diode 16 and resistor 30, which juncture is designated as J1 and the cathode of the tube 40 which is also connected through crystal diode 47 to the input terminal 45 and to the output terminal 48.

In Fig. 3*a* the curves V*i*, V*o*, D*v*, J1, J2 and J3 respectively represent the voltage at the input terminal 25, output terminal 48, dynode 13, juncture J1, juncture J2 and juncture J3.

In order to fully explain the operation of the novel circuitry employed it is assumed that the trigger circuit is initially in the Down condition, the tube 17 is cut off and the cathode follower tube 40 is less conductive. The condensers 36 and 45 are not charged, the dynode voltage D*v* is at a value of —50 volts and the voltage at J3 is +25 volts.

The first input pulse V*i* applied to the input terminal 25 increases the voltage at juncture J2 from —50 to +25 volts so that both sides of the crystal diode 35 are at the same voltage, hence no voltage change is applied to the control grid of the tube 17 and it remains non-conductive.

This same pulse causes conduction through diode 47 and an increase of the voltage at the output terminal from —50 volts to +25 volts. This voltage change is transferred through the condenser 45 and appears as a pulse at J1. This pulse is applied through diode 16 to the dynode of the tube 10 and to the control grid of the cathode follower tube 40. This pulse causes the dynode voltage to be increased above its voltage corresponding to the point US of Fig. 1*a* as indicated by the curve D*v*, Fig. 3*a*, and in accordance with the previous explanation herein the dynode voltage continues to increase and hence the cathode follower tube 40 is rendered more conductive.

When the input pulse V*i* ceases the output voltage V*o* tends to fall or decrease but is prevented from doing so by the cathode follower tube 40. This is accomplished because the cathode of the cathode follower tube 40 is connected to the juncture of the condenser 45 and diode 47 as is the output terminal 48. Hence, the high voltage at the cathode of the cathode follower tube 40 caused by its high conductivity is also present at the output terminal 48. The trigger circuit is now in the Up condition and remains there until disturbed by external means.

The condenser 45 is now charged with its top plate minus and its bottom plate plus and the condenser 36 is charged with its right hand plate minus (−50 volts, the voltage at the input terminal 25) and its left hand plate positive.

The next pulse V*i* does not cause conduction through diode 47. The voltage difference across its terminals is insufficient to cause conduction because of the high conductivity of the cathode follower tube 40. However, this pulse is transferred through condenser 36 and applies the positive pulse shown by curve J2 to the diode 35 to render it conductive thereby producing the positive pulse shown by curve J3. This positive pulse renders the tube 17 conductive. The decreased voltage at the anode of the tube 17 pulls down or decreases the voltage on the dynode 13 to which it is connected to a value below the voltage value corresponding to the point US of Fig. 1*a*. The trigger circuit therefore switches to the Down condition and the cathode follower tube 40 conducts only slightly to produce a decreased voltage at the output terminal 48 as indicated by the curve V*o* and a decreased voltage at the juncture J2 as indicated by the curve J2. When the input voltage ceases the tube 17 returns to its non-conductive or cut-off condition. The circuit is now in its initial starting condition as prior to the application of the first input pulse. Subsequent input pulses cause a repetition of the operation set forth. Hence, each two input pulses cause an increase and a decrease in the output voltage. The above described circuitry is described and claimed in the application of John J. Lentz, Serial No. 262,803 filed December 21, 1951, and entitled "Secondary Emission Type Trigger Circuit."

Referring to Fig. 4 the novel counter includes four trigger circuits, designated T1, T8, T2 and T4 from left to right. Each of these trigger circuits is similar to the others and operates in a manner similar to that of the trigger circuit shown in Fig. 3.

The trigger circuit T1 will be described in detail followed by a description of the interconnection of the trigger circuits to form the counter and the description of the operation of the counter.

The trigger circuit T1 includes a secondary emission tube 60, a grid controlled tube 61 and a cathode follower tube CF62. The cathode and first grid of the secondary emission tube 60 are connected directly to the −50 volt line 63. The second and third grid of the tube 60 are connected directly to the +25 voltage line 64 and the dynode 65*d* of the tube 60 is connected to a crystal diode 65. This diode is connected through a capacitor 66 and a lead 67 to the cathode of tube CF62 and to the input line 68 to the right hand terminal crystal diode 69 which is connected to the input terminal 70. Diode 65 is also connected through resistor 71 to 12,000 ohms and coil 72 of 5 millihenrys to the −50 voltage line 63. The coil 72 is provided to effect peaking at high operating speeds. The dynode 65*d* is also connected through a lead 74 to the control grid of the tube CF62 and through leads 74 and 75 to the plate of the tube 61. The third grid and cathode of tube 61 are connected directly to the −230 volt line 76 and the second grid is connected to ground. The first grid of tube 61 is connected through resistor 77 of 33,000 ohms to the −250 volt line 78 and through coupling capacitor 79 and resistor 80 of 10,000 ohms to the +25 volt line 64. The juncture of capacitor 79 and resistor 80 is connected through a crystal diode 81, resistor 82 of 12,000 ohms, and coil 83 of five millihenrys to the cathode of CF62. The juncture of diode 81 and resistor 82 is connected through the capacitor 85 to the input line between the diode 69 and the input terminal 70. The cathode of tube CF62 is connected through resistor 86 of 47,000 ohms to the −250 volt line 78 and the plate of tube CF62 is connected directly to the +250 volt line 88.

If it is assumed that the trigger circuit T1 is initially in the Down condition then the voltage at the dynode 65*d* is low, the tube 61 is conductive, and the cathode follower CF62 is only slightly conductive. The voltage at the right hand terminal at the crystal diode 69 is at the same low voltage value as the cathode of cathode follower tube CF62.

The first positive input pulse is applied through the capacitor 85 to the diode 81, but is of insufficient amplitude to cause conduction through the diode because of the low voltage transferred to it through the coil 83 and resistor 82 from the cathode of the tube CF62. Hence, this pulse is ineffective to change the conduction condition of the tube 61.

This first input pulse causes diode 69 to be rendered conductive and a positive pulse to be transferred over the lead 67 to the capacitor 66 which applies a positive pulse to the diode 65 and causes it to be rendered conductive because of the low voltage at its lower terminal connected to the dynode 65*d*. The dynode voltage is thus increased above the value corresponding to the point US (Fig. 1*a*) and the trigger circuit assumes the Up condition. An increased voltage is transferred to the control grid of the cathode follower tube CF62 and it is rendered highly conductive and the voltage at its cathode is increased. Also, the increased dynode voltage is applied to the plate of the tube 61 and causes it to be rendered non-conductive. However, when the trigger circuit finally assumes the Up condition the voltage at the cathode of the tube CF62 increases and causes an increased voltage to be applied to the diode 81 and the capacitor 66 charges with its right hand plate positive and its left hand plate negative. The terminal of the diode 65 connected to the dynode 65*d* is more positive than the terminal connected through resistor 71 and coil 72 to the −50 volt line 63.

The next input pulse renders diode 69 conductive as does the first pulse, but for the reason set forth above the diode 65 is not rendered conductive and hence no change in the stable condition of the trigger circuit is caused by the positive pulse applied over the lead 67.

However, as pointed out above the relative voltages at the terminal of the diode 81 are such that the input pulse applied to it through the capacitor 85 renders it conductive. This causes a pulse to be transferred through the capacitor 79 to the first grid of the tube 61 and renders that tube plate current conductive. The resulting decreased voltage at the plate of the tube 61 pulls down the voltage at the dynode 65*d* below that corresponding to the point US (Fig. 1*a*) and the trigger circuit is returned to the Down condition thereby completing one cycle of operation.

Crystal diodes 90, 91 and 92 are each similar to the diodes 69 and are connected in series therewith and to the trigger circuits T8, T2 and T4 respectively, to supply input pulses thereto simultaneously with the application of input pulses to the trigger circuit T1 through the diode 69.

It should be noted that capacitor 66 associated with the trigger circuit T8 is not connected between the diode 65 thereof and the cathode of the cathode follower tube, but is connected from that diode 65 through a lead 93 to the lead 67 connected to the cathode of the cathode follower tube of the trigger circuit T4. This single connection when used in conjunction with the simultaneous input connections of the invention is sufficient to effect conversion of the counter from binary to decade operation.

The description of the operation of the novel counter will be undertaken by conjoint reference to Fig. 4 and to Table I below wherein D represents the Down condition for the respective trigger circuits and similarly U represents the Up condition.

*Table I*

| Input Pulse | Trigger Circuit | | | | | | | |
|---|---|---|---|---|---|---|---|---|
| | T1 | | T8 | | T2 | | T4 | |
| 0 | D | ------ | D | ------ | D | ------ | D | ------ |
| 1 | ------ | U | ------ | U | ------ | U | ------ | U |
| 2 | D | ------ | ------ | U | ------ | U | ------ | U |
| 3 | ------ | U | D | ------ | ------ | U | ------ | U |
| 4 | D | ------ | D | ------ | ------ | U | ------ | U |
| 5 | ------ | U | D | ------ | D | ------ | ------ | U |
| 6 | D | ------ | D | ------ | D | ------ | ------ | U |
| 7 | ------ | U | D | ------ | ------ | U | D | ------ |
| 8 | D | ------ | D | ------ | ------ | U | D | ------ |
| 9 | ------ | U | D | ------ | D | ------ | D | ------ |
| 0 | D | ------ | D | ------ | D | ------ | D | ------ |

In the zero or initial starting condition each of the trigger circuits is assumed to be in the Down condition as indicated by Table I.

The next or first input pulse, in accordance with the above explanation of the switching of the individual trigger circuits causes simultaneous conduction through the crystal diodes 69, 90, 91 and 92 and effects a switching of all the trigger circuits to the Up condition. This means that the voltage at the cathode of each of the cathode follower tubes is high and that this voltage is transferred over the respective lead 67 to the right hand terminal of the diodes 69, 90, 91 and 92. This increased voltage is sufficient to prevent conduction through each of the diodes so long as the trigger circuit connected thereto is in the Up condition. In view of the fact that the corresponding input crystal diode is rendered non-responsive to input pulses when its trigger circuit is in the Up condition it is readily seen that conduction of all such diodes to its right in Fig. 4 in response to input pulses is prevented. Hence, in the novel counter of the invention when one of the trigger circuits is in the Up condition all trigger circuits to its right are non-responsive to input pulses.

It should be noted that this switching of the trigger circuit T8 to the Up condition is accomplished in the conventional manner as is the case with switching of the trigger circuits T1, T2 and T4. This switching of the trigger circuit T8 is accomplished in response to the conduction of the diode 92 which causes a positive pulse to be transferred over the lead 67 connected thereto, the lead 93, capacitor 66 and diode 65 to the dynode of the secondary emission tube 65d of the trigger circuit T8. This pulse effects the switching in the same manner as would be the case if the capacitor 66 were connected to the lead 67 connected to the diode 90 and the pulse received therefrom. A switching of the trigger circuit T8 to the Up condition could therefore occur only when the trigger circuit T4 is simultaneously switched. However, a switching of the trigger circuit T8 to the Down condition is accomplished in the conventional manner.

The second input pulse is applied through the capacitor 85, diode 81 and capacitor 79 to the first grid of the tube 61 of the trigger circuit T1 to render it plate current conductive and thereby switch the trigger circuit to the Down condition for the reason set forth in connection with the operation of the trigger circuit. Since the trigger circuit T1 was in the Up condition when this input pulse was applied to it conduction does not occur through the diode

69 and the stable condition of the trigger circuits T8, T2 and T4 is unaffected. However, the voltage at the cathode of the cathode follower tube CF62 of the trigger circuit T1 is now low so that the diode 69 will be rendered conductive by the next input pulse applied to it.

The third input pulse causes the trigger circuit T1 to be switched to the Up condition and the trigger circuit T8 to be switched to the Down condition. Since the trigger T8 was in the Up condition when the input pulse was applied the diode 90 is not rendered conductive and the stable condition of the trigger circuits T2 and T4 are therefore unaffected. However, the switching of the trigger circuit T8 to the Down condition places low voltage at the right hand terminal of the diode 90 so that it will be rendered conductive when the next input pulse is applied to it.

The fourth input pulse switches the trigger circuit T1 to the Down condition. However, since it was in the Up condition when the pulse was applied the diode 69 is not rendered conductive and the input pulse is not applied to subsequent input diodes.

The fifth input pulse causes the diode 69 to be rendered conductive and the trigger circuit T1 to be switched to the Up condition. The diode 90 is rendered conductive and the trigger circuit T2 is switched to the Down condition in the usual manner. It should be noted, however, that the novel circuit arrangement prevents a switching of the trigger circuit T8 to the Up condition, although the diode 90 is rendered conductive. This is because the resulting positive pulse appearing at the lead 67 is only applied to the cathode of the cathode follower tube CF62 of the trigger circuit T8 and is not applied to the diode 65*d* of the trigger circuit T8. This pulse is ineffective to change the stable condition of the trigger circuit T8 since the voltage at the cathode of the tube CF62 is already high because of the heavy conductivity of that tube. Hence, the trigger circuit T8 is switched by the input pulse in the conventional manner only to the Down condition. It is noted in connection with the first input pulse that a switching of this trigger circuit from the Down to the Up condition occurs only when the trigger circuit T4 is switched from the Down to the Up condition.

The sixth input pulse switches the trigger T1 circuit from the Up to the Down condition, but has no effect on the stable condition on any of the other trigger circuits because the trigger circuit T1 was initially in the Up condition and the diode 69 is therefore not rendered conductive by the input pulse.

The seventh input pulse simultaneously renders the diodes 69, 90, and 91 conductive because the trigger circuits T1, T8 and T2 connected to those respective diodes are in the Down condition. The diode 92 is not rendered conductive because the trigger circuit T4 is in the Up condition. It follows that the trigger circuits T1 and T2 are switched to the Up condition and the trigger circuit T4 is switched to the Down condition. The trigger circuit T8 is not switched at all for the reason set forth hereinbefore.

The eighth input pulse switches the trigger circuit T1 to the Down condition, non-conduction of the diode 69 preventing a change in the stable condition of any other trigger circuit.

The ninth input pulse switches the trigger circuit T1 to the Up condition and switches the trigger circuit T2 to the Down condition.

The tenth input pulse switches the trigger circuit T1 to the Down condition and is ineffective to change the stable condition of any other trigger circuit. Each trigger circuit is now in the Down condition and the counter is returned to its initial starting or zero condition having completed one complete cycle of operation.

It is now clear that the input diodes 90, 91 and 92 are actually connected as a switching matrix external to and selectively controlled by the static storage effected by the trigger circuit.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. In a binary-decade electronic counter; first, second, third and fourth binary trigger circuits each having first and second stable conditions alternately assumed and first and second input terminals connected to first and second electrical paths respectively to effect a switching of said trigger circuit to said first and second stable conditions respectively when an input pulse is applied to the respective said terminals; a source of input pulses to be counted; first, second, third and fourth crystal diodes, each having first and second terminals and connected in series chain with said source of input pulses and corresponding respectively to said first, second, third and fourth trigger circuits; connections between said first and second input terminals of each trigger circuit, except the second terminal of the second and fourth trigger circuits, and the respective terminal of the corresponding crystal diode; and connections between the second terminal of the fourth crystal diode and the second input terminal of the second and fourth trigger circuits.

2. The counter set forth in claim 1 wherein each of said second electrical paths effects transfer of a preselected voltage at the respective trigger circuit to the corresponding terminal of the crystal diode to determine conductivity of the latter in response to pulses from said source.

3. The counter set forth in claim 2 wherein each of said first electrical paths includes a capacitive element to isolate steady voltage at the trigger circuit from the corresponding diode to which it is connected through said first electrical path.

4. The counter set forth in claim 1 wherein each of said first electrical paths includes a capacitive element to isolate steady voltage at the trigger circuit from the corresponding diode to which it is connected through said first electrical path.

5. The counter set forth in claim 4 including a voltage transfer network connected between said trigger circuit and the second terminal of said second crystal diode to transfer a steady voltage to said diode corresponding to that voltage transfer to said first, third and fourth diodes, through said second paths of the first, third and fourth trigger circuits, respectively.

6. In an electronic circuit having a plurality of electrical switches, each having first and second stable conditions and normally arranged to complete a cycle of operation in response to a certain number of pulses, including a source of pulses; a plurality of input diodes, each having a pair of terminals, and connected in series with said source of pulses, each corresponding to one of said electrical switches; and voltage transferring means connecting at least one of said switches to each terminal of its corresponding input diode to effect voltage transfer to the latter from the switch.

7. In an electronic circuit having a plurality of electrical switches each having first and second stable conditions and normally arranged to complete a cycle of operation in response to a certain number of pulses including a source of pulses, a plurality of input diodes connected in series to said source of pulses, each corresponding to a different one of said electrical switches; pulse transferring means connecting each switch to one terminal of its diode for transferring a pulse to each switch to change it from the first to the second stable condition; first input switching means connecting the other terminal of each diode to its corresponding switch, except one preselected switch to transfer a pulse to that switch when the diode is rendered conductive by a pulse from said source of pulses to change the switch from the second to the first stable condition; second input switching means connecting said preselected switch to said other terminal of a diode corresponding to a different switch so that the two switches are changed simultaneously to the first stable condition; and voltage transferring means connecting each switch to said other terminal of its corresponding diode.

8. A binary-decade electronic counter having first, second, third and fourth inherently binary trigger circuits, each including a secondary emission tube having a dynode exhibiting a high voltage when the trigger circuit is in the Up condition and a low voltage when the trigger circuit is in the Down condition and including a source of input pulses to be counted; first, second, third and fourth unidirectional current devices corresponding respectively to said first, second, third and fourth trigger circuits and each having first and second terminals and connected in series chain to said source; a circuit from the first terminal of each of said devices to said dynode to switch the trigger circuit to the Down condition when an input pulse is applied to the first terminal of the device; and circuit means connecting a second terminal of said device and said trigger circuits to selectively switch said trigger circuit to the Up condition to thereby convert said counter to decade operation.

9. A binary-decade electronic counter having first, second, third and fourth inherently binary trigger circuits, each including a secondary emission tube having a dynode exhibiting a high voltage when the trigger circuit is in the Up condition and a low voltage when the trigger circuit is in the Down condition and including a source of input pulses to be counted; first, second, third and fourth unidirectional current devices corresponding respectively to said first, second, third and fourth trigger circuits and each having first and second terminals and connected in series chain to said source; a circuit from the first terminal of each of said devices to said dynode to switch the trigger circuit to the Down condition when an input pulse is applied to the first terminal of the device; voltage transferring circuit means connected between each trigger circuit and the second terminal of the corresponding current device to transfer increased voltage thereto when the trigger circuit is switched to the Up condition to render the device current responsive to input pulses; a pulse transferring means connected between the second terminal of the first and third current devices and the dynode of the corresponding trigger circuits and the second terminal of the fourth current device and the dynode of the second and fourth trigger circuits respectively to switch the trigger circuit to the Down condition when the device connected thereto is rendered conductive to thereby convert said counter from binary to decade operation.

10. In a binary-decade counter having four inherently binary trigger circuits, input means including a source of input pulses to be counted connected to four serially connected diodes; first circuit means connected between one terminal of each diode and a corresponding trigger circuit to effect a switching of that trigger circuit to one stable condition in response to an input pulse causing current conduction of the next prior serially connected diode; second circuit means connected between the other terminal of two of said diodes and the corresponding trigger circuits to effect a switching of the trigger circuits to the other stable condition when the corresponding diode is rendered current conductive by an input pulse and between the other terminal of one of said diodes and the two remaining trigger circuits to effect a switching of said two remaining trigger circuits to the other stable condition when the diode is rendered current conductive by an input pulse; and voltage transferring means between each trigger circuit and the said other terminal of the corresponding diode to transfer a voltage to the latter dependent upon the stable condition of the former.

11. In an electronic circuit including a plurality of electronic switches responsive to a predetermined number of electrical changes to complete a cycle of operation; input means connected to apply said electrical changes to each of said switches, said input means including a plurality of serially connected voltage responsive devices selectively connected to said switches; and voltage transferring means connecting each of said devices to one of said switches including means coupling the voltage present at a preselected point in each switch to the device connected thereto to control the conductivity of that device.

12. A binary-decade counter including four inherently binary switches each connected individually to a source of pulses to be counted and switchable only in response to a pulse from said source; connections from each switch, except one, to the input connections of only one other switch to control an electrical condition at said input connections; and a single common input connection from the one of said switches not connected to the input connections of any other switch to one other switch to transfer an input pulse simultaneously to the two switches, whereby input pulses are selectively applied to the switches to cause cyclic operation in response to each ten pulses from said source.

References Cited in the file of this patent

UNITED STATES PATENTS

| | | |
|---|---|---|
| 2,342,753 | Pearson et al. | Feb. 29, 1944 |
| 2,398,771 | Compton | Apr. 23, 1946 |
| 2,426,278 | Mumma | Aug. 26, 1947 |
| 2,540,442 | Grosdoff | Feb. 6, 1951 |
| 2,614,141 | Edson et al. | Oct. 14, 1952 |